United States Patent [19]

Sato et al.

[11] Patent Number: 5,290,736
[45] Date of Patent: Mar. 1, 1994

[54] METHOD OF FORMING INTERLAYER-INSULATING FILM USING OZONE AND ORGANIC SILANES AT A PRESSURE ABOVE ATMOSPHERIC

[75] Inventors: Nobuyoshi Sato; Kyoji Tokunaga; Tomoharu Katagiri; Tsuyoshi Hashimoto; Tomohiro Ohta, all of Chiba, Japan

[73] Assignee: Kawasaki Steel Corporation, Hyogo, Japan

[21] Appl. No.: 764,901

[22] Filed: Sep. 24, 1991

[30] Foreign Application Priority Data

Sep. 25, 1990 [JP] Japan ................................. 2-251801
Sep. 11, 1991 [JP] Japan ................................. 3-231840

[51] Int. Cl.$^5$ ........................................ H01L 21/316
[52] U.S. Cl. ........................ 437/238; 148/DIG. 118; 427/255.3; 437/240
[58] Field of Search .................. 437/235, 238, 240; 357/71; 148/DIG. 118; 427/255.2, 255.3

[56] References Cited

U.S. PATENT DOCUMENTS 4,072,947 10/1989 Wang et al. ...................... 437/238
4,845,054 7/1989 Mitchener .
4,900,591 2/1990 Bennett et al. .

OTHER PUBLICATIONS

Lee et al., "Sub-Atmospheric Chemical Vapor Deposition (SACVD) of TEOS-Ozone USG and BPSG", VMIC Conference, Jun. 12-13, 1990, pp. 396-398.
Kotani et al., "Low-Temperature APCVD oxide using TEOS-ozone chemistry for Multilevel Interconnections," I.E.D.M., 1989, pp. 669-672.
Wolf et al., "Silicon Processing for the VLSI Era", Lattice Press, Calif., 1986, pp. 168-169.

Primary Examiner—Olik Chaudhuri
Assistant Examiner—Ken Horton
Attorney, Agent, or Firm—Oliff & Berridge

[57] ABSTRACT

A silicon oxide film to be used as an interlayer-insulating film in a semiconductor device is formed by a high pressure organic silane-$O_3$ CVD. A semiconductor wafer is placed in a reaction vessel and is heated at a temperature of 350° C. A mixture of an organic silane gas such as TEOS, HMDS and OMCTS and an ozone gas is introduced into the reaction vessel and the reaction is carried out at a pressure higher than the atmospheric pressure, preferably at a pressure of about 2 atm to form a silicon oxide film having excellent properties. A life time of the ozone gas which serves as an oxiding agent and/or catalyst can be prolonged under the high pressure, and therefore a deposition rate of the silicon oxide film ca be increased and the flatness of the silicon oxide film can be improved. Therefore, the silicon oxide film forming process can be performed efficiently and a flatening process after the formation of the silicon oxide film can be made simpler.

8 Claims, 2 Drawing Sheets

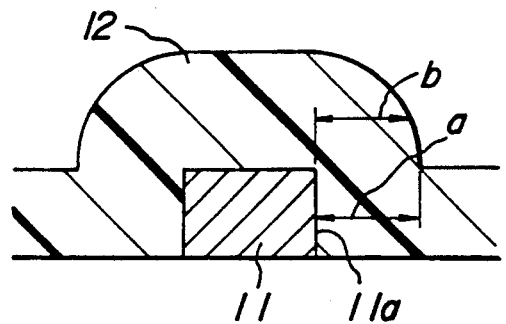
FIG_2
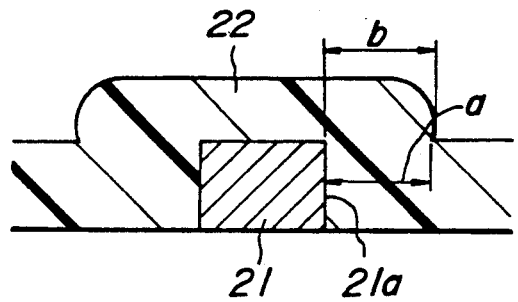
FIG_3
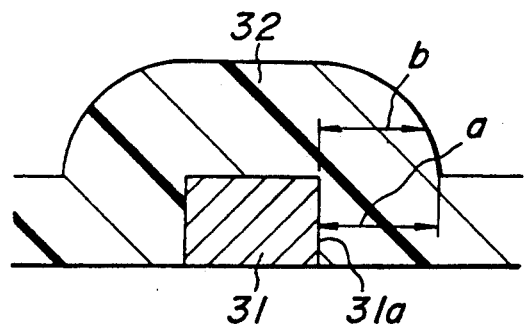
FIG_4
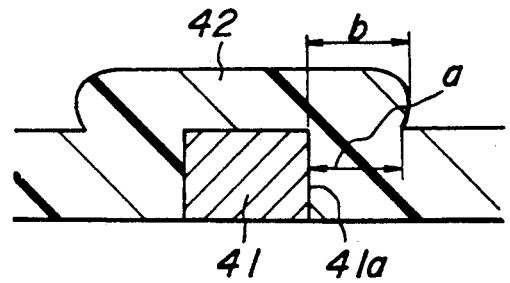
FIG_5

METHOD OF FORMING INTERLAYER-INSULATING FILM USING OZONE AND ORGANIC SILANES AT A PRESSURE ABOVE ATMOSPHERIC

BACKGROUND OF THE INVENTION

1. Field of the Invention and Related Art Statement

The present invention generally relates to a method of producing an insulating film for use as an interlayer-insulating film provided between a semiconductor substrate and a metal layer or between upper and lower metal layers of a semiconductor integrated circuit, and more particularly to a method of producing an insulating film consisting of an organic silane-$O_3$ CVD film.

Nowadays the so-called VLSI (Very Large Scale Integrated circuit) has been manufactured at a high integration and the integration density has become higher and higher, so that the manufacture of the semiconductor device has required a sub-micron process. In accordance with the progress of the sub-micron process, a surface of the semiconductor device is liable to have large undulation. Depressions and protrusions formed in the surface of the semiconductor device have posed serious restriction upon the manufacture of the semiconductor device. Therefore, it has been earnestly required to improve the technique for flattening the surface of the semiconductor substrate.

An interlayer-insulating film of the sub-micron device must have such a property that a space in the order of sub-microns can be attained and a high flatness can be achieved even on the undulation having a large aspect ratio.

In Japanese Patent Laid-open Publication Kokai Sho 61-77695, there is disclosed a method of producing a silicon oxide interlayer-insulating film by the atmospheric pressure CVD using organic silane-$O_3$ gas. In this Publication, TEOS (tetra ethoxy silane) is used as the organic silicate material.

In the known atmospheric pressure CVD method using organic silane-ozone gas, there are some problems that the film deposition rate is low, there is formed a rather large overhung, and the film forming temperature is rather high. For instance, the deposition rate in the known atmospheric pressure CVD method is about 500 to 700 Å per minute at a temperature of 400° to 500° C., so that it takes 6 to 8 hours for forming interlayer-insulating films having a thickness of 1 μm on twenty five wafers. Further, since the flatness of the insulating film is poor, the semiconductor wafer must be heated at a higher temperature after the formation of the insulating film, and this might deteriorate characteristics of the semiconductor devices.

SUMMARY OF THE INVENTION

The present invention has for its object to provide a novel and useful method of producing an interlayer-insulating film, in which the film can be formed at a high deposition rate and an excellent flatness can be attained at a lower temperature.

According to the invention, a method of producing an interlayer-insulating film to be used as an interlayer-insulating film between a semiconductor substrate and a metal layer or between metal layers by placing a semiconductor substrate in a reaction vessel and by introducing a mixture of an organic silane gas and an ozone gas into the reaction vessel, being characterized in that said reaction vessel is kept at a pressure higher than the atmospheric pressure. In the method, the semiconductor substrate is heated in the reaction vessel at a temperature of 350° C. to 450° C.

In the known organic silane-ozone atmospheric pressure CVD, a life time of the ozone is short, because the reaction is performed under the atmospheric pressure. One may consider to increase a partial pressure of the ozone in the mixture of the organic silane gas and the ozone gas. However, this solution causes a decrease in a partial pressure of the organic silane, so that the deposition rate might be decreased.

In the method according to the invention, the formation of the silicon oxide interlayer-insulating film by the organic silane-ozone CVD is carried out under the pressure higher than the atmospheric pressure, a life time of the ozone in the organic silane-ozone mixture gas is increased and the deposition rate can be increased. Further, since the flatness of the insulating silicon oxide film is excellent, the flattening process after the formation of the film can be performed at a relatively low temperature, so that the characteristics of the semiconductor devices are not affected.

BRIEF DESCRIPTION OF THE DRAWINGS

FIG. 2 is a cross sectional view illustrating an insulating film formed by the first example of the method according to the invention;

FIG. 3 is a cross sectional view depicting an insulating film produced by the first comparative example;

FIG. 4 is a cross sectional view showing an insulating film formed by the second example of the method according to the invention; and FIG. 5 is a cross sectional view depicting an insulating film produced by the second comparative example.

DETAILED EXPLANATION OF THE PREFERRED EMBODIMENTS

Figure 1:
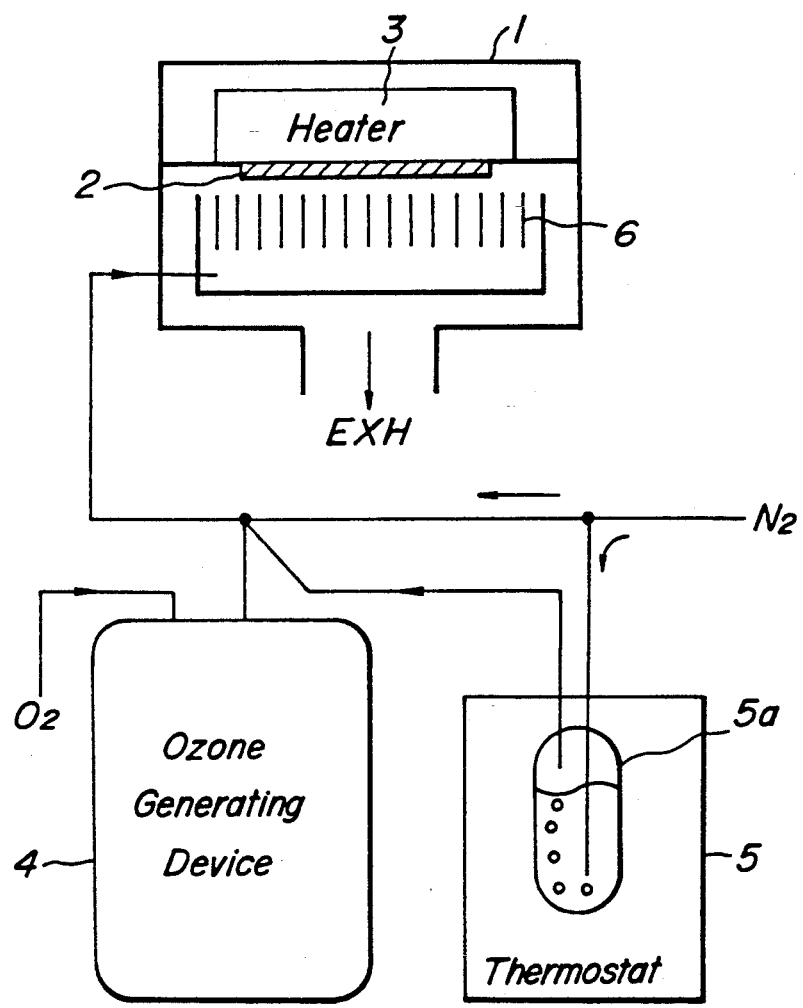
FIG. 1 is a schematic view showing an embodiment of an apparatus for carrying out the method according to the invention.

FIG. 1 is a schematic view showing an embodiment of an apparatus for carrying out the method of producing the insulating film according to the invention. The apparatus comprises a reaction vessel 1 and an electric heater 3 provided in the reaction vessel 1. A silicon wafer 2 is installed in the reaction vessel 1 and is heated at a desired temperature. The apparatus further comprises an ozone generating device 4 and a thermostat 5. In the thermostat 5, there is arranged a gas bubbler 5a which contains an organic silicate material such as TEOS, HMDS and OMCTS and through which a nitrogen gas is supplied to generate an organic silane gas. A nitrogen gas is also used as a carrier gas. The ozone gas generated by the ozone generating device 4, the organic silane gas generated by the thermostat 5 and the nitrogen carrier gas are supplied to the reaction vessel 1. In the reaction vessel 1 there are further arranged vanes 6 for regulating the mixture gas so that a laminated gas stream can be projected against the silicon wafer 2.

EXAMPLE 1

The mixture containing the ozone gas and the TEOS gas at a ratio of 3:50 was introduced into the reaction vessel 1 and the pressure inside the reaction vessel was maintained at 2 atm. The silicon wafer 2 was heated by the heater 3 at a temperature of 350° C. The deposition was performed for 480 seconds. The temperature inside the reaction vessel 1 was about 350° C. and the gas bubbler 5a arranged in the thermostat 5 was kept at a temperature of 65° C. The flow rate of O₂ gas into the ozone generating device 4 was set to 7.5 liters per minute, the flow rate of the nitrogen gas into the gas bubbler 5a in the thermostat 5 was set to 3.0 liters per minute, and the nitrogen gas flow rate into the reaction vessel 1 was set to 18.0 liters per minute. The ozone gas generating factor in the ozone generating device 4 was 4.0%.

COMPARATIVE EXAMPLE 1

Similar to the above mentioned example 1, TEOS was used as the organic silane and a SiO₂ film was produced by the known atmospheric pressure CVD. A mixture including the TEOS gas and the ozone gas at a ratio of 50:3 was supplied to the reaction vessel which was kept at the atmospheric pressure, the silicon wafer was heated at 350° C. and the deposition was conducted for 1200 seconds. The remaining conditions were same as those of the previous example 1.

The results of the above example 1 and comparative example 1 are shown in the following table 1.

TABLE 1

| Organic Silane: TEOS | | |
|---|---|---|
|  | Example 1 | Comparative Example 1 |
| Deposition temperature | 350° C. | 400° C. |
| Gas tubular temperature | 65° C. | 65° C. |
| Flow rate of gas bubbling nitrogen | 3.0 l/min | 3.0 l/min |
| Flow rate of oxygen to ozone generating device | 7.5 l/min | 7.5 l/min |
| Ozone generating ratio | 4.0% | 4.0% |
| Flow rate of carrier nitrogen gas | 18.0 l/min | 18.0 l/min |
| Pressure (atm) | 2 | 1 |
| Deposition time | 480 sec | 1200 sec |
| Wafer temperature | 350° C. | 350° C. |
| Deposition rate (Å/min) | 1000 | 400 |
| Degree of overhung | −0.1 | +0.2 |

As can be understood from the above table 1, in the known TEOS-O₃ CVD under the atmospheric pressure, the deposition rate is 400 Å per minute, but in the method according to the invention in which the deposition was carried out under the higher pressure of 2 atm, the deposition rate was 1000 Å per minute. That is to say, according to the invention, the deposition rate is increased by more than twice.

Next, the flatness of the insulating films formed by the above mentioned example 1 and comparative example 1 was checked. This was conducted by estimating the step coverage of the SiO₂ films formed on aluminum layers.

FIG. 2 is a cross sectional view showing a SiO₂ film 12 formed on an aluminum layer 11 under the pressure higher than the atmospheric pressure (example 1) and FIG. 3 is a cross sectional view illustrating a SiO₂ film 22 formed on an aluminum layer 21 under the atmospheric pressure (comparative example 1).

As shown in FIGS. 2 and 3, the degree of the overhung is expressed by a ratio of a distance b between an extending line of a side wall 11a of the aluminum layer 11 and a middle level point of a side wall of the insulating film 12 to a thickness a of the insulating film 11 grown on the side wall of the aluminum layer 11. That is to say, the degree of overhung listed in the table 1 was calculated by the following equation.

$$b/a - 1$$

As shown in the table 1, in the known atmospheric pressure TEOS-O₃ CVD method, there is a large overhung, in the high pressure TEOS-O₃ CVD method according to the invention, the overhung has not been recognized.

In the above example 1, the SiO₂ insulating film was formed by performing the thermal decomposition reaction of the mixture of TEOS-O₃ gas under the high pressure of 2 atm. The inventors have found that according to the invention the above mentioned merit could be obtained by performing the deposition under the pressure of 1.5 atm to 5 atm. It has been also confirmed that the pressure higher than the atmospheric pressure, but is not higher than 2 atm is most preferable in the points of the deposition rate and flatness.

EXAMPLE 2

In the Example 2, HDMS (hexa methyl disiloxane) was used as an organic silicate material. A mixture containing a HDMS gas and an ozone gas at a ratio of 50:3 was introduced into the reaction vessel 1 which was kept at a pressure of 2 atm. A silicon wafer 2 was heated at a temperature of 350° C. The deposition was carried out for 400 seconds to form a SiO₂ film. The inside of the reaction vessel 1 was heated at a temperature of 350° C. and the gas bubbler 5a provided in the thermostat 5 was heated at a temperature of 65° C. To the ozone generating device 4 the oxygen gas was supplied at a flow rate of 7.5 liters per minute. A flow rate of the nitrogen gas to the gas bubbler 5a in the thermostat 5 was set to 3.0 liters per minute and a flow rate of the carrier nitrogen gas to the reaction vessel 1 was set to 18.0 liters per minute. An ozone generating factor in the ozone generating device 4 was 4.0%.

COMPARATIVE EXAMPLE 2

Similar to the example 2, the HMDS gas was used as the organic silane and the insulating SiO₂ film was formed under the atmospheric pressure. A mixture including the HMDS gas and the ozone gas at a ratio of 50:3 was supplied to the reaction vessel 1 which was kept at the atmospheric pressure, the wafer was heated at 350° C. and the deposition was conducted for 400 seconds. The remaining conditions were same as those of the previous example 2.

The results of the above example 2 and comparative example 2 are shown in the following table 2.

TABLE 2

| Organic Silane: HMDS | | |
|---|---|---|
|  | Example 2 | Comparative Example 2 |
| Deposition temperature | 350° C. | 400° C. |
| Gas tubular temperature | 65° C. | 65° C. |
| Flow rate of gas bubbling nitrogen | 3.0 l/min | 3.0 l/min |
| Flow rate of oxygen to ozone generating device | 7.5 l/min | 7.5 l/min |
| Ozone generating ratio | 4.0% | 4.0% |
| Flow rate of carrier nitrogen gas | 18.0 l/min | 18.0 l/min |
| Pressure (atm) | 2 | 1 |
| Deposition time | 400 sec | 800 sec |
| Wafer temperature | 350° C. | 350° C. |
| Deposition rate (Å/min) | 1100 | 550 |

TABLE 2-continued

| Organic Silane: HMDS | | |
|---|---|---|
| | Example 2 | Comparative Example 2 |
| Degree of overhung | −0.2 | +0.3 |

As can be understood from the table 2, in the known method of atmospheric pressure HMDS-O$_3$ CVD, the deposition rate of the silicon oxide film was 500 Å per minute, but in the method according to the invention in which HMDS was used as the organic silane gas and the reaction was carried out under the pressure of 2 atm, the deposition rate was 1100 Å per minute which is larger than that of the known method by 2 times.

The flatness of the silicon oxide film was estimated by measuring the step coverage of the silicon oxide films formed on the aluminum films.

FIG. 4 is a cross sectional view showing a SiO$_2$ film 32 formed on an aluminum layer 31 under the pressure higher than the atmospheric pressure by using HMDS as the organic silane gas (example 2) and FIG. 5 is a cross sectional view illustrating a SiO$_2$ film 42 formed on an aluminum layer 41 under the atmospheric pressure also by using HMDS as the raw material gas (comparative example 2).

As shown in FIGS. 4 and 5, the degree of the overhung is expressed by a ratio of a distance b between an extending line of a side wall 31a or 41a of the aluminum layer 31 or 41 and a middle level point of a side wall of the insulating film 32 or 42 to a thickness a of the insulating film 31 or 41 grown on the side wall of the aluminum layer 31 or 41. That is to say, the degree of overhung listed in the table 2 was calculated by the following equation.

$$b/a - 1$$

As shown in the table 2, in the known atmospheric pressure HMDS-O$_3$ CVD method, there was produced a large overhung, but in the high pressure HMDS-O$_3$ CVD method according to the invention, no overhung was recognized.

The inventors have experimentally found that in the method according to the invention, the silicon oxide films having good properties could be formed by setting the pressure inside the reaction vessel to 1.5 to 5 atm, and particularly when the pressure is maintained at a pressure of about 2 atm it is possible to obtain a silicon oxide film having excellent properties at a very high deposition rate. It should be noted that the pressure inside the reaction vessel may be increased more than 5 atm, but in such a case the manufacturing apparatus has to be constructed so that it can withstand such a high pressure.

The present invention is not limited to the embodiments explained above, but many modifications and alternations may be conceived by those skilled in the art within the scope of the invention. For instance, in the above embodiments TEOS and HMDS were used as the organic silicate material, but according to the invention other organic silicate material such as OMCTS (octa methyl cyclo tetrasiloxane) may be used. In case of using OMCTS, the thermostat 5 is kept at a lower temperature such as 45° C. Further the silicon wafer 2 supported by the heater 3 may be vibrated such that the thickness of the silicon oxide film can be made much even over its whole surface.

As explained above in detail, in the high pressure organic silane-O$_3$ CVD method according to the present invention, the life time of the ozone is prolonged as compared with the known atmospheric pressure organic silane-O$_3$ CVD method, and therefore the deposition rate can be increased and the insulating film having the excellent flatness can be formed at a lower temperature. Such an insulating film can be advantageously used as the interlayer-insulating film of the integrated circuit.

What is claimed is:

1. A method of producing an interlayer-insulating film to be provided between a semiconductor substrate and a metal layer or between metal layers of a semiconductor device comprised of placing the semiconductor substrate in a reaction vessel, heating said semiconductor substrate in the reaction vessel, and introducing a mixture of an organic silane gas and an ozone gas into the reaction vessel, wherein said reaction vessel is kept at a pressure of 1.5 to 5 atm.

2. A method according to claim 1, wherein said reaction vessel is kept at a pressure of about 2 atm.

3. A method according to claim 1, wherein said organic silane gas is formed by an organic silicate material selected from a group consisting of tetra ethoxy silane, hexa methyl disilane and octa methyl cyclo tetrasiloxane.

4. A method according to claim 1, wherein said semiconductor substrate is heated at a temperature of 350° to 450° C.

5. A method according to claim 1, said mixture of the organic silane gas and the ozone gas is introduced into said reaction vessel by using a carrier gas.

6. A method according to claim 5, wherein said carrier gas is a nitrogen gas.

7. A method according to claim 6, wherein said organic silane gas is formed by flowing the nitrogen gas through a gas bubbling device.

8. A method according to claim 1, wherein said mixture contains the organic silane gas and the ozone gas at a ratio of 50:3.

* * * * *